United States Patent [19]
Uehara et al.

[11] Patent Number: 4,745,606
[45] Date of Patent: May 17, 1988

[54] DUAL-WAVELENGTH LASER APPARATUS

[75] Inventors: Kiyoji Uehara, Fukagawa; Hiroaki Tanaka, Koganei; Takashi Ueki, Ohta; Hideo Tai, Higashi-Ikebukuro, all of Japan

[73] Assignee: Tokyo Gas Co., Ltd., Tokyo, Japan

[21] Appl. No.: 841,913

[22] Filed: Mar. 20, 1986

[30] Foreign Application Priority Data

Mar. 28, 1985 [JP] Japan ................................ 60-61876

[51] Int. Cl.$^4$ ........................... H01S 3/10; H01S 3/13
[52] U.S. Cl. ........................................ 372/23; 372/26; 372/28; 372/29; 372/32
[58] Field of Search ..................... 372/11, 23, 28, 21, 372/29, 32, 26

[56] References Cited

U.S. PATENT DOCUMENTS 4,434,490  2/1984  Kavaya et al. .................... 372/28
4,504,950  3/1985  Auyeung .......................... 372/11
4,606,031  8/1986  Beene et al. ...................... 372/28

OTHER PUBLICATIONS

Moore, "Gas-Laser Frequency Selection by Molecular Absorption", Applied Optics Letters to the Editor, vol. 4, No. 2, Feb. 1965, pp. 252-253.
Yocom et al., "A Study of Selective Absorbers for Single-Mode Operation of $CO_2$ TEA Lasers", IEEE Journal of Quantum Electronics, vol. QE-16, No. 11, Nov. 1980, pp. 1192-1194.
Matsumoto, "Stabilization Method of an Infrared Two-Wavelength Laser", Applied Physics 24, No. 1, pp. 65-66, Jan. 1981.
Bagayev et al., "Narrow Resonances in Radiation Spectrum of the He-Ne Laser with Methane Absorber", Applied Physics 10, No. 3, pp. 231-235, Jul. 1976.

Primary Examiner—Eugene R. LaRoche
Assistant Examiner—Michael B. Shingleton
Attorney, Agent, or Firm—Townsend and Townsend

[57] ABSTRACT

A dual-wavelength laser apparatus includes a laser emitting a laser beam consisting of two wavelength components, a methane cell for controlling and equalizing gains of the two wavelength components, a cavity length modulator including a piezoelectric element for periodically modulating the cavity length of the laser, and a feedback circuit for controlling the modulation center such that the sum of outputs of the two modulated wavelength components is kept substantially constant. The feedback circuit includes a detector for detecting a laser output, a lock-in amplifier for detecting and amplifying an output from the detector, an integrator for integrating an output from the lock-in amplifier, and a high-voltage amplifier for generating a bias voltage set by the integrator.

13 Claims, 4 Drawing Sheets

Voltage applied to piezo-electric element (V)

ial measurements and pollu-
DUAL-WAVELENGTH LASER APPARATUS

BACKGROUND OF THE INVENTION

1. Field of the Invention

The present invention relates to a dual-wavelength laser apparatus for generating a laser beam consisting of two wavelength components.

2. Description of the Prior Art

Since a laser beam of a specific wavelength tends to be absorbed in a certain gas, the presence or absence of the gas can be detected therewith, as is well known to those skilled in the art. Sensing techniques using this principle have been in widespread use in a variety of applications such as industrtion monitoring. A good example is a He-Ne laser which has two component lines of 3.3922 $\mu$m ($\lambda_1$) and 3.3912 $\mu$m ($\lambda_2$). The wavelength $\lambda_1$ is strongly absorbed by methane, but the wavelength $\lambda_2$ is little absorbed thereby. The differential absorption at these two wavelengths provides a sensitive method of detecting the presence of methane. Since methane is the major constituent of city gas, methane gas leak detection allows city gas leak detection.

U.S. Pat. No. 4,489,239 describes a methane leak sensor of this type. FIG. 1 of this prior art patent illustrates a sensor system using two He-Ne lasers of 3.3922 $\mu$m and 3.3912 $\mu$m. In this sensor system, two mechanical choppers modulate laser beams of different wavelengths from the two He-Ne lasers at different frequencies. The modulated laser beams propagate in the air, and the components in outputs from a sensor synchronized with the modulation frequencies are detected by a lock-in amplifier. The presence or absence of methane is then detected according to an output ratio.

According to another conventional methane leak detection technique, a single chopper wheel or a chopper-mirror wheel is used to alternately emit two different wavelength components. In this case, if these wavelength components have equal intensity, the frequency component synchronized with the chopper detected by the lock-in amplifier gives the difference of absorbance between the two wavelengths and allows methane leak detection.

The methane leak detection system of this type uses a large number of mirrors and beam splitters making its optical system complex and bulky. In addition, optical alignment is cumbersome and the laser beam loss is large. Deviations in optical misalignment due to vibrations, temperature changes, or the like must be taken care. Signal processing is complex and high-frequency modulation cannot be achieved owing to the limitation in operation of the mechanical chopper, thus decreasing the signal to noise ratio. In the former example, two choppers and two lock-in amplifiers are required (in addition to the two lasers), thereby increasing the overall size of the apparatus. In the latter example, it is difficult to tune the two different wavelength components to equal amplitudes, because the outputs are unbalanced by, for example, temperature changes.

Still another conventional sensor system which solves some problems of the sensor system with two He-Ne lasers is proposed in FIG. 4 of the prior art U.S. patent described above. In this conventional sensor system, a He-Ne plasma tube is placed in an invar-stabilized cavity composed of three mirrors. Two of those mirrors constitute a Fabry-Perot interferometer which selects the wavelength. The piezoelectric disc oscillates one of the mirrors, thereby achieving alternate intensity modulation at the two wavelengths.

Since a chopper is no longer necessary with dual-wavelength laser, the overall structure can be simplified. In this case, a cell containing a small amount of methane may be inserted into the cavity in order to equalize the gain at both laser wavelengths so that equal power is generated at each wavelength. However, since no feedback mechanism is provided, the outputs of the two wavelength components cannot be completely equalized and may be unbalanced owing to, for example, temperature changes.

As cited in lines 56-62, column 9 of the prior art patent described above, the paper "Improved Use of Gratings in Tunable Lasers," by J. E. Bjorkholm, T. C. Damen, and J. Shaw (published in *Optics Communication*, Vol. 4 (1971), p. 283 (1971)), describes a three-mirror cavity. In this cavity, a half mirror is arranged just in front of a grating to improve the reflectivity of the grating and to increase the output. In the arrangement, the half mirror and the grating constitute a Fabry-Perot interferometer. The mirror position must be controlled very precisely to achieve a high reflectivity.

SUMMARY OF THE INVENTION

It is an object of the present invention to provide a simple dual-wavelength laser apparatus with a single laser and an optical system consisting of a smaller number of mirrors and beam splitters.

It is another object of the present invention to provide a dual-wavelength laser apparatus wherein two wavelength components can be easily equalized.

It is still another object of the present invention to provide a dual-wavelength laser apparatus wherein optical adjustment is not efficient and an optical loss is small.

It is still another object of the present invention to provide a dual-wavelength laser apparatus wherein cavity efficiency can be improved to obtain a high laser output.

It is still another object of the present invention to provide a dual-wavelength laser apparatus wherein high-frequency modulation can be performed to provide an improved signal to noise ratio.

The above and other objects, features, and advantages of the present invention will be apparent from the following detailed description in conjunction with the accompanying drawings.

DETAILED DESCRIPTION OF THE PREFERRED EMBODIMENT

The present invention will be described in detail with reference to the accompanying drawings. A dual-wavelength laser apparatus exemplified below is applied to methane leak detection. However, the present invention is not limited to this application.

Figure 1:
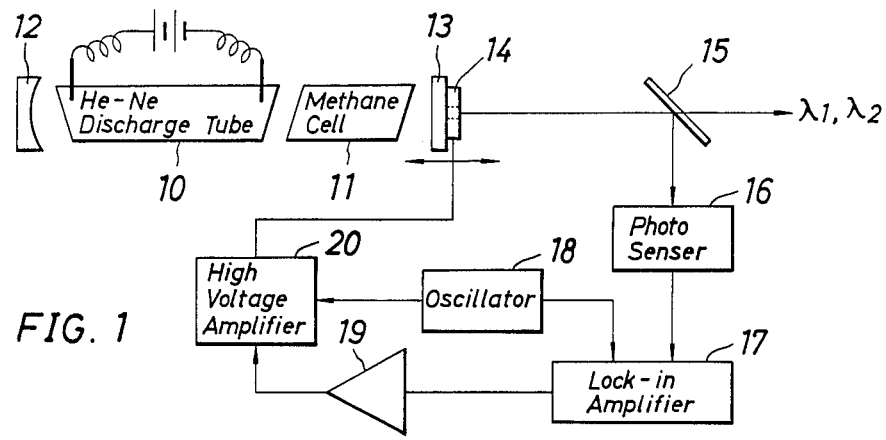
FIG. 1 is a system diagram of a dual-wavelength laser apparatus according to an embodiment of the present invention.

FIG. 1 shows a dual-wavelength laser apparatus for detecting methane according to an embodiment of the present invention. Reference numeral 10 denotes a He-Ne discharge tube; 11, a methane cell containing methane gas; and 12 and 13, mirrors. The He-Ne discharge tube 10, the methane cell 11 and the mirrors 12 and 13 constitute a He-Ne laser. The mirror 13 is vibrated by a piezoelectric element 14 at a predetermined frequency to modulate a cavity length L between the mirrors 12 and 13. Reference numeral 15 denotes a beam splitter arranged along the optical path of a laser beam from the He-Ne laser; 16, a detector such as an InAs detector; 17, a lock-in amplifier for detecting an output component of the detector 16 which is changed in synchronism with the frequency of an oscillator 18; 19, an integrator for integrating an output from the lock-in amplifier 17; and 20, a high-voltage amplifier for mixing outputs from the integrator 19 and the oscillator 18 and amplifying the composite signal thereof to provide a high voltage. The piezoelectric element 14 is driven by this high voltage.

Figure 2:
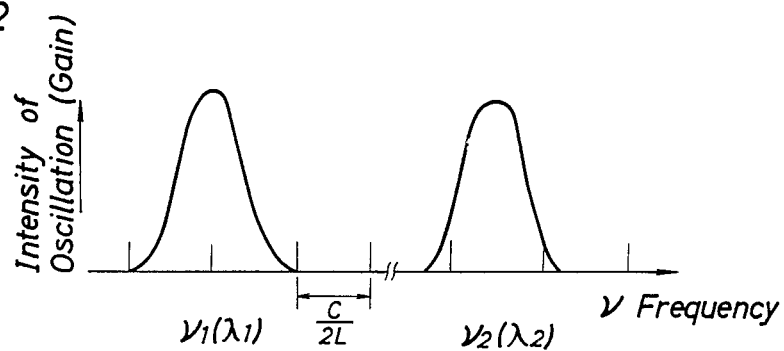
FIG. 2 is a graph showing the relationship between the oscillation frequency and the gain of a dual-wavelength laser in the apparatus of FIG. 1.
Figure 3:
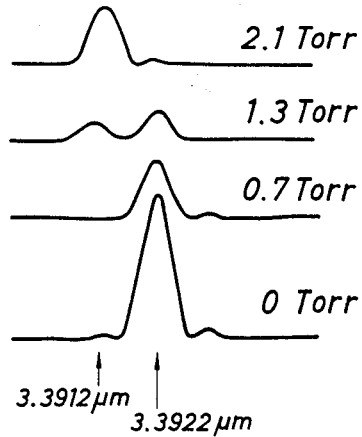
FIG. 3 is a graph showing changes in two wavelength outputs from the He-Ne laser at various methane pressure in the methane cell.

The He-Ne laser can emit two oscillation lines at wavelengths of 3.3922 $\mu$m ($\lambda_1$) and 3.3912 $\mu$m ($\lambda_2$). Under normal conditions, the 3.3912 $\mu$m oscillation is completely suppressed by the 3.3922 $\mu$m oscillation since the $\lambda_1$ component has a much higher gain than the $\lambda_2$ component. However, since the methane cell 11 is arranged in the cavity of the He-Ne laser apparatus of the present invention to absorb the beam of the $\lambda_1$ component, a total gain of the $\lambda_1$ component is decreased. When a methane pressure is properly selected, the gain of the $\lambda_1$ component becomes substantially equal to that of the $\lambda_2$ component. Therefore, as shown in FIGS. 2 and 3, simultaneous oscillation can be performed. In this case, an amount of absorption of the $\lambda_1$ component by the methane cell 11 is changed with the methane pressure, as shown in FIG. 3. Therefore, the methane pressure must be adjusted to a proper value.

The relationship between the cavity length and the laser output will be described. A gas laser gain curve represents Doppler broadening near the center frequency inherent to a laser medium. Among all frequencies, only a frequency $\nu_r$ satisfying resonance condition $\nu_r = nC/2L$ (where L is the cavity length, C is the light velocity, and n is an integer) is subjected to oscillation (FIG. 2) of the cavity. The output increases when the frequency $\nu_r$ approaches the center frequency. When the frequency $\nu_r$ is shifted away from the center frequency, the output decreases. When the cavity length L is continuously changed, the frequencies $\nu_r$ sequentially cross the center frequency. Therefore, oscillation intensity changes periodically in accordance with changes in cavity length L.

Figure 4:
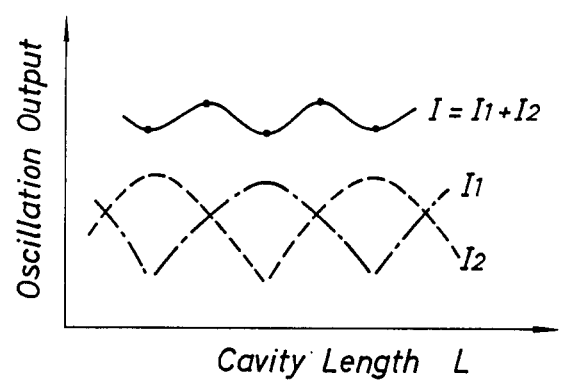
FIG. 4 is a graph showing the relationship between the cavity length and the laser output from the apparatus of FIG. 1.

In dual-wavelength oscillation each wavelength component changes periodically as described above. If the cavity length L is chosen to satisfy the equation:

$$L \approx (\lambda_1 \lambda_2 / 2 |\lambda_1 - \lambda_2|)(\tfrac{1}{2} + \text{integer})$$

output intensity variations of the $\lambda_1$ and $\lambda_2$ components vs. cavity length are 180° out of phase to each other, as shown in FIG. 4.

When the cavity length is changed (modulated) around $L_0$ with an amplitude $\Delta l$ at a frequency f, laser output $I_1$ at $\lambda_1$ and $I_2$ at $\lambda_2$ and total output I are given as follows:

$$I_1 = I_1(L_0) + dI_1(L_0)/dL \cdot \Delta l \sin 2\pi ft + \text{high-order component}$$

$$I_2 = I_2(L_0) + dI_2(L_0)/dL \cdot \Delta l \sin 2\pi ft + \text{high-order component}$$

$$\begin{aligned} I &= I_1 + I_2 \\ &= I_1(L_0) + I_2(L_0) + \{dI_1(L_0)/dL + dI_2(L_0)/dL\} \cdot \\ &\quad \Delta l \sin 2\pi ft + \text{high-order component} \end{aligned}$$

The modulated frequency f component of the total output I is phase-detected by the lock-in amplifier 17, and an output therefrom is fed back as an error signal to the piezoelectric element 14 through the high-voltage amplifier 20, so that the modulation center $L_0$ of the cavity length L can be automatically controlled to satisfy the equation $$dI_1(L_0)/dL + dI_2(L_0)/dL = 0 \qquad (1)$$

The equation (1) leads to $dI_1(L_0)/dL = -dI_2(L_0)/dL$ which means that two components are modulated 180° out of phase to each other.

The detector 16, the lock-in amplifier 17, the integrator 19, and the high-voltage amplifier 20 in FIG. 1 thus constitute a feedback circuit. The total output I of the laser beam is detected by the infrared detector 16. Only the modulated frequency component is detected by the lock-in amplifier 17. The output from the lock-in amplifier 17 is integrated by the integrator 19 to provide a bias voltage of the high-voltage amplifier 20. The high-voltage amplifier 20 generates a high voltage varying at the oscillation frequency of the oscillator 18 superposed on the bias voltage to drive the piezoelectric element 14. When the cavity length L is changed due to a temperature change or the like during operation, the high voltage is corrected through the feedback circuit.

With the automatic control, the output intensities of the wavelengths $\lambda_1$ and $\lambda_2$ from the He-Ne laser are modulated 180° out of phase to each other, but the total output intensity is subjected to null intensity modulation. When this laser beam propagates through the air containing methane gas, only the $\lambda_1$ component is absorbed by methane and the total intensity has a modulated component, thereby giving a signal of detecting methane. A modulated component output upon complete absorption of the $\lambda_1$ component into methane is:

$$(dI_2(L_0)/dL) \cdot \Delta l$$

Figure 5A:
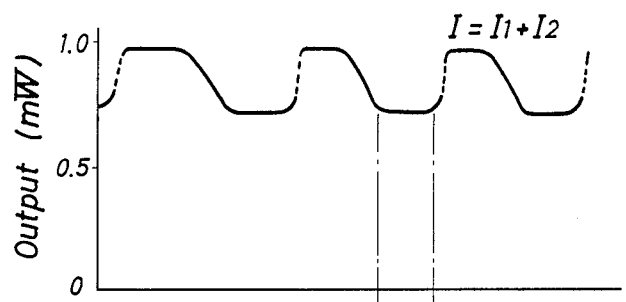
FIGS. 5A, 5B and 5C are graphs showing the observed output changes as a function of a voltage applied to the piezoelectric element of the apparatus of FIG. 1.
Figure 5B:
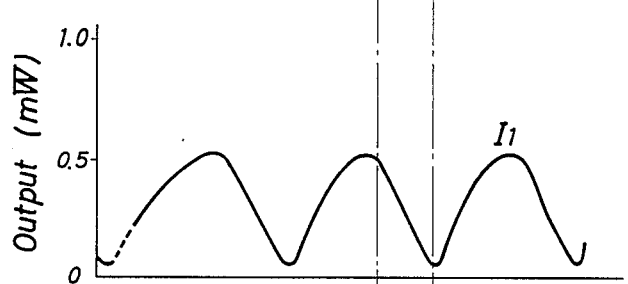
Figure 5C:
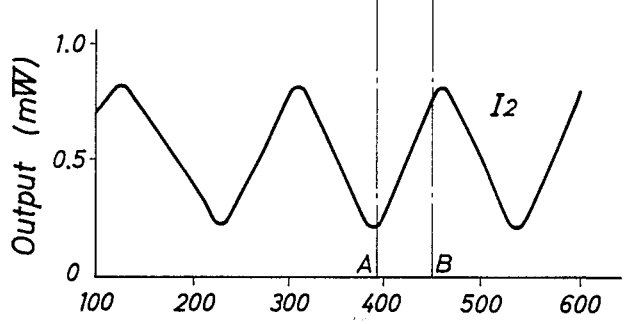

FIGS. 5A, 5B and 5C are experimental results when a He-Ne laser apparatus of the present invention is operated under the following conditions: a cavity length of 683 mm; a discharge current of 6 mA; a Ne gas pressure of 0.4 Torr; a He gas pressure of 2 Torr; a methane cell length of 42 mm; and a methane gas pressure of 2 Torr. A voltage applied to the piezoelectric element 14 is plotted along the abscissas of FIGS. 5A, 5B and 5C. The cavity length is decreased by about 1 $\mu$m each time the voltage is increased by 100 V. The total output of the laser apparatus is plotted along the ordinate of FIG. 5A, the output of the $\lambda_1$ component is plotted along the ordinate of FIG. 5B, and the output of the $\lambda_2$ component is plotted along the ordinate of FIG. 5C. As is apparent from these graphs, if the voltage applied to the piezoelectric element 14 fixed to the mirror 13 is changed between points A and B to modulate the cavity length, each frequency component is subjected to 0.5 mW modulation. However, the total output is free from intensity modulation.

Figure 6:
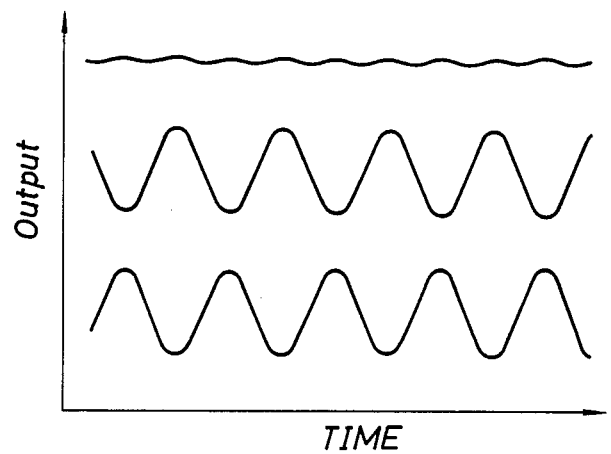
FIG. 6 shows the waveforms of the laser output at respective wavelengths and a composite waveform thereof when the apparatus of FIG. 1 is controlled by a servo loop.
Figure 7:
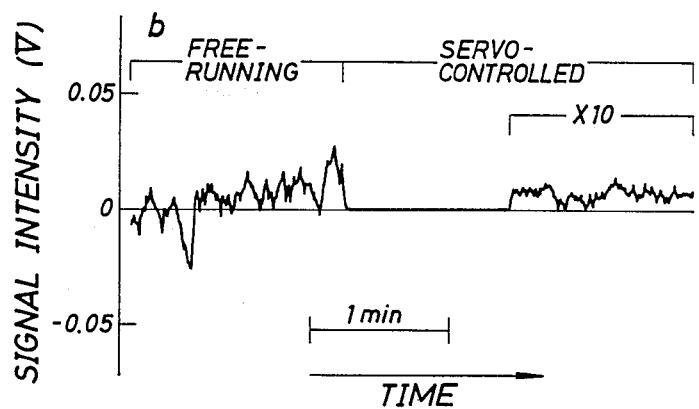
FIG. 7 shows the error signals from the lock-in amplifier when the apparatus of FIG. 1 is operated in the free-running and servo-controlled modes.

FIG. 6 shows the waveforms of the 3.3912 and 3.3922 $\mu$m lines and the total output emitted from the present dual-wavelength He-Ne laser when it is controlled with the servo loop. The individual emissions are modulated alternately at 1 kHz with a 0.7 mW peak-to-peak amplitude while the total intensity is modulated primarily at 2 kHz. In FIG. 7, the time variation of the error signals both in the free-running and servo-controlled modes is shown. The residual fundamental modulation in FIG. 7 when the servo control is on is calculated to be 0.25 $\mu$W peak-to-peak. This is about 1/3000 of the modulation amplitude, 0.7 mW peak-to-peak, of the individual lines.

The methane pressure to maximize the modulation amplitude of the individual lines is about 2 Torr in the absorption cell 4.2 cm long. When the methane pressure is changed to 1 or 3 Torr, the amplitude decreases to 70% or 65%, respectively, of the value obtained at 2 Torr. If the methane-air mixture is used instead of pure methane, the modulation amplitude available becomes very small because the loss is almost frequency-independent owing to pressure broadening.

In the above embodiment, in order to obtain the same gain for the two wavelength components of the laser beam from the He-Ne laser, a cell properly absorbing only one of the two components is inserted in the cavity. However, mirrors having a proper wavelength-dependent reflectivity can also be used to equalize the gains.

Figure 8A:
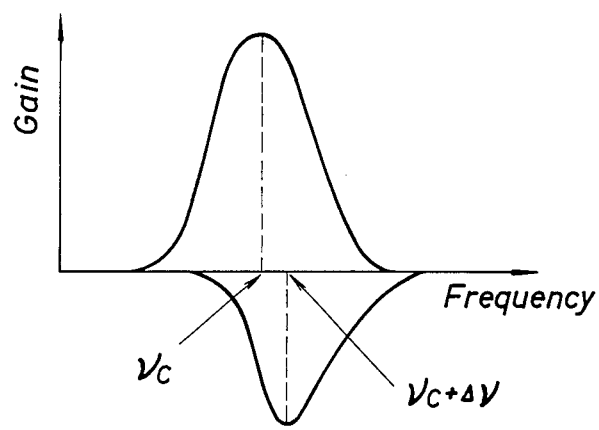
FIGS. 8A and 8B are graphs for explaining the effect of a frequency-dependent loss on the modulation amplitude.
Figure 8B:
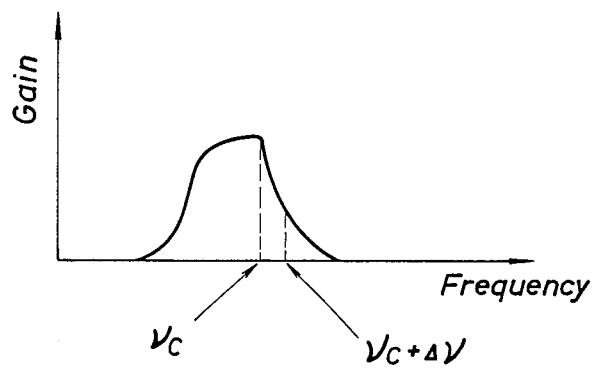

In order to increase the intensity modulation amplitude of the two wavelength components, a gas absorption cell filled with an absorption material of steep frequency dependency can be inserted in the cavity. Referring to FIG. 8A, the upper curve represents the frequency characteristics of the gain of the laser medium, and the lower curve represents the frequency characteristics of the absorption material. As shown in FIG. 8B, the net gain greatly changes in response to a slight changes in frequency. In the above embodiment, methane serves as such an absorption material.

This method for increasing the modulation amplitude can be applied not only to a dual-wavelength laser apparatus but also to a single wavelength laser apparatus.

The present invention can also be applied to other dual-wavelength lasers such as other gas lasers (e.g., $CO_2$ laser), liquid lasers, solid-state lasers, and semiconductor lasers. For example, a $CO_2$ laser is used for dual-wavelength oscillation using an R(2) line of the 9.380534 $\mu$m wavelength strongly absorbed by ammonia and a P(4) line of the 9.428857 $\mu$m wavelength not absorbed by ammonia.

What is claimed is:

1. A dual-wavelength laser apparatus characterized by comprising: a laser for emitting a laser beam consisting of two wavelength components; gain control means for controlling and substantially equalizing gains of the two wavelength components; cavity length modulating means for periodically modulating a cavity length of said laser; and modulation center controlling means for controlling a modulation center of said cavity length modulating means, such that a sum of output intensity of the two modulated wavelength components from said laser is held constant.

2. An apparatus according to claim 1, wherein said gain control means comprises a gas for absorbing a specific wavelength, the gas being filled in a cavity of said laser.

3. An apparatus according to claim 1, wherein said cavity length modulating means includes a piezoelectric element.

4. An apparatus according to claim 1, wherein said laser comprises a He-Ne laser for emitting two wavelengths of 3.3912 $\mu$m and 3.3922 $\mu$m.

5. An apparatus according to claim 2, wherein the gas is methane gas.

6. An apparatus according to claim 1, wherein said laser comprises a He-Ne discharge tube and two mirrors arranged at two ends thereof, along the axial direction.

7. An apparatus according to claim 1, wherein said modulation center controlling means comprises a feedback circuit.

8. An apparatus according to claim 1, wherein said modulation center controlling means includes a detector for detecting a laser output, a lock-in amplifier for detecting and amplifying an output from said detector, an integrator for integrating an output from said lock-in amplifier, and a high-voltage amplifier for generating a bias voltage set by said integrator.

9. An apparatus according to claim 1, wherein said laser comprises a gas laser.

10. An apparatus according to claim 1, wherein said laser comprises a liquid laser.

11. An apparatus according to claim 1, wherein said laser comprises a solid-state laser.

12. An apparatus according to claim 1, wherein said laser comprises a semiconductor laser.

13. An apparatus according to claim 12 wherein the cavity length is prescribed so that the output intensities of the two wavelength components are 180 degrees out of phase to each other.

* * * * *